US011817313B2

(12) United States Patent
Mutyala et al.

(10) Patent No.: US 11,817,313 B2
(45) Date of Patent: Nov. 14, 2023

(54) METHODS FOR PRESSURE RAMPED PLASMA PURGE

(71) Applicant: Applied Materials, Inc., Santa Clara, CA (US)

(72) Inventors: Madhu Santosh Kumar Mutyala, Santa Clara, CA (US); Sanjay Kamath, Fremont, CA (US); Deenesh Padhi, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 472 days.

(21) Appl. No.: 16/782,933

(22) Filed: Feb. 5, 2020

(65) Prior Publication Data

US 2021/0242016 A1 Aug. 5, 2021

(51) Int. Cl.
| | | |
|---|---|---|
| H01L 21/02 | (2006.01) | |
| H01J 37/32 | (2006.01) | |
| C23C 16/40 | (2006.01) | |
| C23C 16/50 | (2006.01) | |

(52) U.S. Cl.
CPC ...... *H01L 21/02274* (2013.01); *C23C 16/401* (2013.01); *C23C 16/50* (2013.01); *H01J 37/32834* (2013.01); *H01L 21/02164* (2013.01); *H01L 21/02216* (2013.01); *H01J 2237/3321* (2013.01)

(58) Field of Classification Search
CPC ......... H01L 21/02274; H01L 21/02164; H01L 21/02216; H01J 37/32834; C23C 16/401; C23C 16/50
See application file for complete search history.

(56) References Cited

U.S. PATENT DOCUMENTS 5,516,367 A 5/1996 Lei et al.
6,139,923 A * 10/2000 Gupta ............... C23C 16/402
438/905

(Continued)

FOREIGN PATENT DOCUMENTS

| CN | 1861838 A | 11/2006 |
| JP | 2014-198872 A | 10/2014 |
| KR | 10-1884555 B1 | 8/2018 |

OTHER PUBLICATIONS

International Search Report and Written Opinion dated May 31, 2021 in International Patent Application No. PCT/US2021/016706, 8 pages.

*Primary Examiner* — Dale E Page
*Assistant Examiner* — Quovaunda Jefferson
(74) *Attorney, Agent, or Firm* — Kilpatrick Townsend & Stockton LLP

(57) ABSTRACT

Exemplary deposition methods may include forming a plasma of a silicon-containing precursor and at least one additional precursor within a processing region of a semiconductor processing chamber. The processing region may house a semiconductor substrate on a substrate support. The methods may include depositing material on the semiconductor substrate to a target thickness. The methods may include halting delivery of the silicon-containing precursor while maintaining the plasma with the one or more precursors. The methods may include purging the processing region of the semiconductor processing chamber.

17 Claims, 3 Drawing Sheets

(56) References Cited

U.S. PATENT DOCUMENTS

| | | | |
|---|---|---|---|
| 6,812,153 B2* | 11/2004 | Hua | C23C 16/507 |
| | | | 257/E21.279 |
| 7,589,031 B2* | 9/2009 | Anwar | C23C 16/345 |
| | | | 257/E21.101 |
| 2009/0041952 A1 | 2/2009 | Yoon et al. | |
| 2010/0255218 A1 | 10/2010 | Oka et al. | |
| 2011/0256726 A1 | 10/2011 | Lavoie et al. | |
| 2016/0172239 A1* | 6/2016 | Padhi | H01L 21/02211 |
| | | | 257/639 |
| 2016/0258065 A1* | 9/2016 | Miura | H01L 21/76802 |

* cited by examiner

METHODS FOR PRESSURE RAMPED PLASMA PURGE

TECHNICAL FIELD

The present technology relates to semiconductor systems and processes. More specifically, the present technology relates to deposition methods for which a plasma purge operation may be performed.

BACKGROUND

Integrated circuits are made possible by processes which produce intricately patterned material layers on substrate surfaces. Producing patterned material on a substrate requires controlled methods of formation and removal of exposed material. As device sizes continue to shrink, particle contamination may be an increasing challenge. During deposition methods, material may deposit on chamber components, and this material may fall to the substrate subsequent deposition, which may affect device quality.

Thus, there is a need for improved systems and methods that can be used to produce high quality devices and structures. These and other needs are addressed by the present technology.

SUMMARY

Exemplary deposition methods may include forming a plasma of a silicon-containing precursor and at least one additional precursor within a processing region of a semiconductor processing chamber. The processing region may house a semiconductor substrate on a substrate support. The methods may include depositing material on the semiconductor substrate to a target thickness. The methods may include halting delivery of the silicon-containing precursor while maintaining the plasma with the one or more precursors. The methods may include purging the processing region of the semiconductor processing chamber.

In some embodiments, forming the plasma may occur at a first plasma power, and maintaining the plasma may include reducing plasma power from the first plasma power to a second plasma power. The second plasma power may be less than or about 1,000 W. The method may include delivering a blocking precursor from beneath the substrate support while depositing the material. The deposition method may include halting delivery of the blocking precursor during the purging of the processing region. The semiconductor substrate may be positioned at a first distance from a faceplate during the depositing. The method may include lowering the semiconductor substrate to a second distance from the faceplate during the purging of the processing region. The silicon-containing precursor may be or include tetraethyl orthosilicate.

Depositing material on the semiconductor substrate may be performed at a first processing pressure. Purging the processing region of the semiconductor processing chamber may include reducing processing pressure from the first processing pressure to a second processing pressure over a period of time. Reducing the processing pressure may include reducing a flow rate of the at least one additional precursor. The flow rate of the at least one additional precursor may be reduced in at least two steps, and each step may occur over a portion of the period of time. Each portion of the period of time may be greater than or about two seconds. Reducing the processing pressure may include increasing an angle of a throttle valve of a purge line of the semiconductor processing chamber. The angle of a throttle valve of a purge line of the semiconductor processing chamber may be increased in at least two steps, and each step may occur over a portion of the period of time. Each portion of the period of time may be greater than or about two seconds.

Some embodiments of the present technology may encompass deposition methods including forming a plasma of a silicon-containing precursor and an oxygen-containing precursor within a processing region of a semiconductor processing chamber. The processing region may house a semiconductor substrate on a substrate support. The methods may include depositing material on the semiconductor substrate to a target thickness. The depositing may be performed at a first processing pressure. The methods may include halting delivery of the silicon-containing precursor while maintaining the plasma with the oxygen-containing precursor. The methods may include purging the processing region of the semiconductor processing chamber.

In some embodiments, purging the processing region of the semiconductor processing chamber may include reducing processing pressure from the first processing pressure to a second processing pressure over a period of time. Reducing the processing pressure may include reducing a flow rate of the oxygen-containing precursor. The period of time may be greater than or about 5 seconds. Reducing the processing pressure may include increasing an angle of a throttle valve of a purge line of the semiconductor processing chamber.

Some embodiments of the present technology may encompass deposition methods. The methods may include forming a plasma of a silicon-containing precursor and an oxygen-containing precursor within a processing region of a semiconductor processing chamber. The processing region may house a semiconductor substrate on a substrate support. The methods may include depositing material on the semiconductor substrate to a target thickness. The depositing may be performed at a first processing pressure. The methods may include halting delivery of the silicon-containing precursor while maintaining the plasma with the oxygen-containing precursor. The methods may include purging the processing region of the semiconductor processing chamber. Purging the processing region of the semiconductor processing chamber may include increasing an angle of a throttle valve of a purge line of the semiconductor processing chamber to reduce processing pressure from the first processing pressure to a second processing pressure over a period of time. In some embodiments, the period of time may be greater than or about 5 seconds. Reducing the processing pressure may include reducing a flow rate of the oxygen-containing precursor.

Such technology may provide numerous benefits over conventional systems and techniques. For example, the systems may limit or minimize deposition of falling particles onto substrates subsequent deposition processes by efficiently purging the system. Additionally, the operations of embodiments of the present technology may reduce the number of falling particles produced during purging operations. Either of these effects may facilitate deposition of thicker films in some embodiments. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
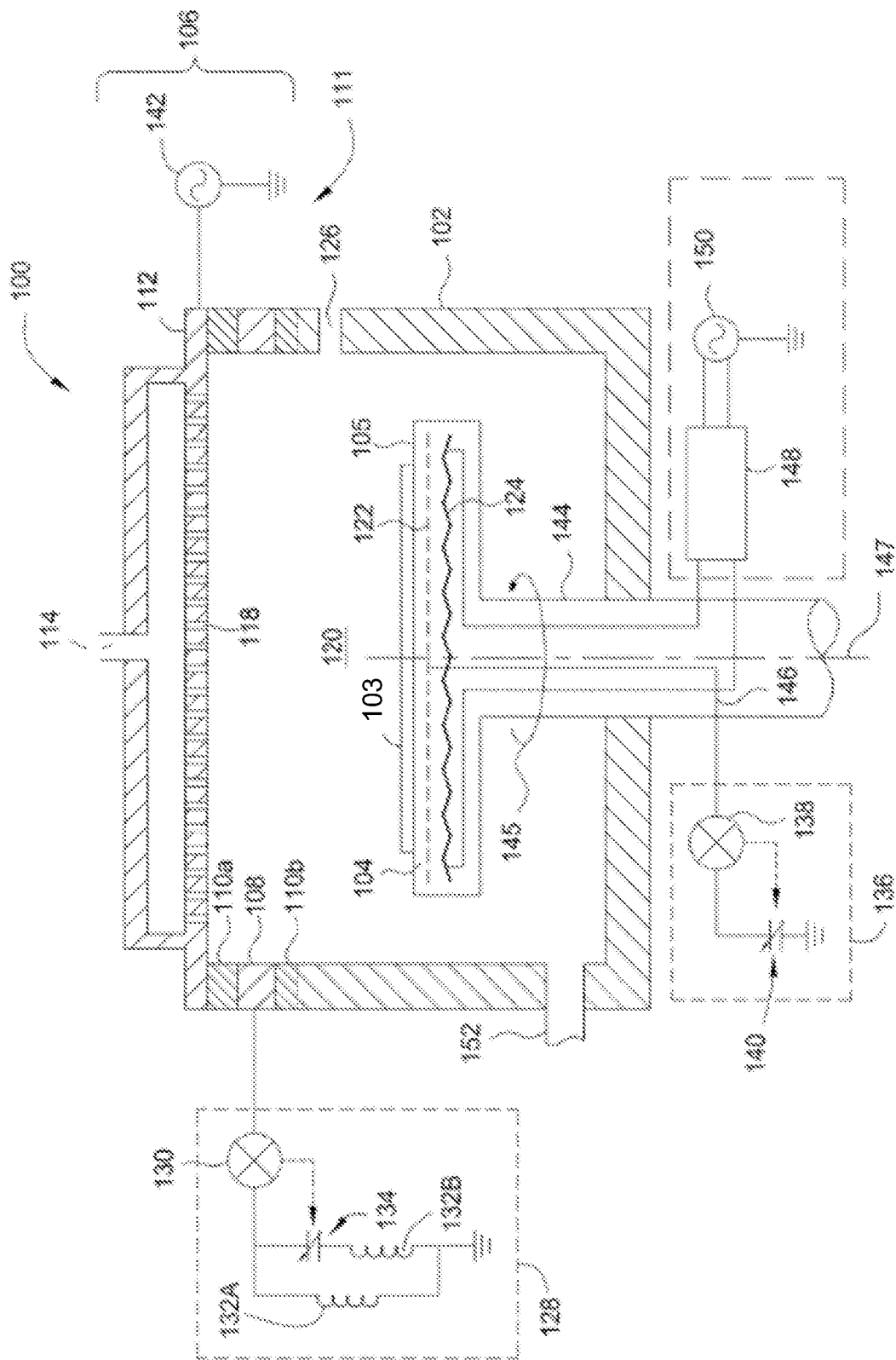
FIG. 1 shows a schematic cross-sectional view of an exemplary processing chamber according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

During material deposition, such as of silicon oxide or other silicon-containing materials, plasma enhanced deposition may produce a local plasma between a faceplate or gas distributor, and a substrate support. As precursors are activated in the plasma, the deposition materials may form and deposit on the substrate. While this deposition is occurring, additional deposition may also occur in the processing chamber, such as dead zones within the chamber, where fluid flow may not be ideal, as well as on the faceplate itself. As the faceplate may be maintained at a lower temperature than the substrate, the material deposited on the faceplate may be of lower quality, and may readily flake or fall from the faceplate. After a deposition process has completed, the pressure within the processing chamber may be lowered to a base pressure at which transfer within the system may occur. This pump down or purge, if performed rapidly, may pull loose particles from the faceplate, and cause them to fall to the substrate, which may produce defects on the formed film, which may degrade or otherwise affect device quality.

Conventional technology has often accepted a certain amount of these residual particle effects. Moreover, many conventional processes specifically modify the deposition operations in an attempt to reduce particle deposition. For example, when thicker films may be deposited, such as greater than or about 1 μm, or greater than or about 5 μm, many conventional technologies will perform the deposition in a two-step process. If performed in a single operation, a greater amount of material may also be deposited on the faceplate, which may be more likely to fall to the substrate during purging. Consequently, conventional technologies may perform half of the deposition followed by a chamber clean to remove residual material on the faceplate or chamber walls prior to performing the second half of the deposition. This may greatly increase queue times for semiconductor processing.

The present technology may adjust processing sequences to limit production and deposition of these particles. For example, the present technology may maintain plasma formation during the purge operation, which may trap particles within the plasma sheath, and allow them to be pumped from the system. Additionally, by performing the purge as a ramped operation, particles deposited on the faceplate may be less likely to be pulled from the surfaces, which may limit the amount of particles to be purged from the system or that may otherwise fall to the substrate. This may facilitate deposition of any number of materials, as well as deposition of thicker films, which may be deposited in a single deposition operation, reducing overall throughput.

After describing general aspects of a chamber configured to perform operations according to embodiments of the present technology in which plasma processing may be performed, specific methodology and component configurations may be discussed. It is to be understood that the present technology is not intended to be limited to the specific films and processing discussed, as the techniques described may be used to improve a number of film formation processes, and may be applicable to a variety of processing chambers and operations.

FIG. 1 shows a cross-sectional view of an exemplary processing chamber 100 according to some embodiments of the present technology. The figure may illustrate an overview of a system incorporating one or more aspects of the present technology, and/or which may be specifically configured to perform one or more operations according to embodiments of the present technology. Additional details of chamber 100 or methods performed may be described further below. Chamber 100 may be utilized to form film layers according to some embodiments of the present technology, although it is to be understood that the methods may similarly be performed in any chamber within which film formation may occur. The processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support during processing. The substrate support 104 may be rotatable, as indicated by the arrow 145, along an axis 147, where a shaft 144 of the substrate support 104 may be located. Alternatively, the substrate support 104 may be lifted up to rotate as necessary during a deposition process.

A plasma profile modulator 111 may be disposed in the processing chamber 100 to control plasma distribution across the substrate 103 disposed on the substrate support 104. The plasma profile modulator 111 may include a first electrode 108 that may be disposed adjacent to the chamber body 102, and may separate the chamber body 102 from other components of the lid assembly 106. The first electrode 108 may be part of the lid assembly 106, or may be a separate sidewall electrode. The first electrode 108 may be an annular or ring-like member, and may be a ring electrode. The first electrode 108 may be a continuous loop around a circumference of the processing chamber 100 surrounding the processing volume 120, or may be discontinuous at selected locations if desired. The first electrode 108 may also be a perforated electrode, such as a perforated ring or a mesh electrode, or may be a plate electrode, such as, for example, a secondary gas distributor.

One or more isolators 110a, 110b, which may be a dielectric material such as a ceramic or metal oxide, for example aluminum oxide and/or aluminum nitride, may contact the first electrode 108 and separate the first electrode 108 electrically and thermally from a gas distributor 112 and from the chamber body 102. The gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the processing chamber. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

The first electrode 108 may be coupled with a first tuning circuit 128 that may control a ground pathway of the processing chamber 100. The first tuning circuit 128 may include a first electronic sensor 130 and a first electronic controller 134. The first electronic controller 134 may be or include a variable capacitor or other circuit elements. The first tuning circuit 128 may be or include one or more inductors 132. The first tuning circuit 128 may be any circuit that enables variable or controllable impedance under the plasma conditions present in the processing volume 120 during processing. In some embodiments as illustrated, the first tuning circuit 128 may include a first circuit leg and a second circuit leg coupled in parallel between ground and the first electronic sensor 130. The first circuit leg may include a first inductor 132A. The second circuit leg may include a second inductor 132B coupled in series with the first electronic controller 134. The second inductor 132B may be disposed between the first electronic controller 134 and a node connecting both the first and second circuit legs to the first electronic sensor 130. The first electronic sensor 130 may be a voltage or current sensor and may be coupled with the first electronic controller 134, which may afford a degree of closed-loop control of plasma conditions inside the processing volume 120.

A second electrode 122 may be coupled with the substrate support 104. The second electrode 122 may be embedded within the substrate support 104 or coupled with a surface of the substrate support 104. The second electrode 122 may be a plate, a perforated plate, a mesh, a wire screen, or any other distributed arrangement of conductive elements. The second electrode 122 may be a tuning electrode, and may be coupled with a second tuning circuit 136 by a conduit 146, for example a cable having a selected resistance, such as 50 ohms, for example, disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled with the second electronic controller 140 to provide further control over plasma conditions in the processing volume 120.

A third electrode 124, which may be a bias electrode and/or an electrostatic chucking electrode, may be coupled with the substrate support 104. The third electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power.

The lid assembly 106 and substrate support 104 of FIG. 1 may be used with any processing chamber for plasma or thermal processing. In operation, the processing chamber 100 may afford real-time control of plasma conditions in the processing volume 120. The substrate 103 may be disposed on the substrate support 104, and process gases may be flowed through the lid assembly 106 using an inlet 114 according to any desired flow plan. Gases may exit the processing chamber 100 through an outlet 152. Electric power may be coupled with the gas distributor 112 to establish a plasma in the processing volume 120. The substrate may be subjected to an electrical bias using the third electrode 124 in some embodiments.

Upon energizing a plasma in the processing volume 120, a potential difference may be established between the plasma and the first electrode 108. A potential difference may also be established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 128, 136 may have a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, may be chosen to provide an impedance range. This range may depend on the frequency and voltage characteristics of the plasma, which may have a minimum in the capacitance range of each variable capacitor. Hence, when the capacitance of the first electronic controller 134 is at a minimum or maximum, impedance of the first tuning circuit 128 may be high, resulting in a plasma shape that has a minimum aerial or lateral coverage over the substrate support. When the capacitance of the first electronic controller 134 approaches a value that minimizes the impedance of the first tuning circuit 128, the aerial coverage of the plasma may grow to a maximum, effectively covering the entire working area of the substrate support 104. As the capacitance of the first electronic controller 134 deviates from the minimum impedance setting, the plasma shape may shrink from the chamber walls and aerial coverage of the substrate support may decline. The second electronic controller 140 may have a similar effect, increasing and decreasing aerial coverage of the plasma over the substrate support as the capacitance of the second electronic controller 140 may be changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. Consequently, a plasma shape may be selected and dynamically controlled during processing. It is to be understood that, while the foregoing discussion is based on electronic controllers 134, 140, which may be variable capacitors, any electronic component with adjustable characteristic may be used to provide tuning circuits 128 and 136 with adjustable impedance.

Figure 2:
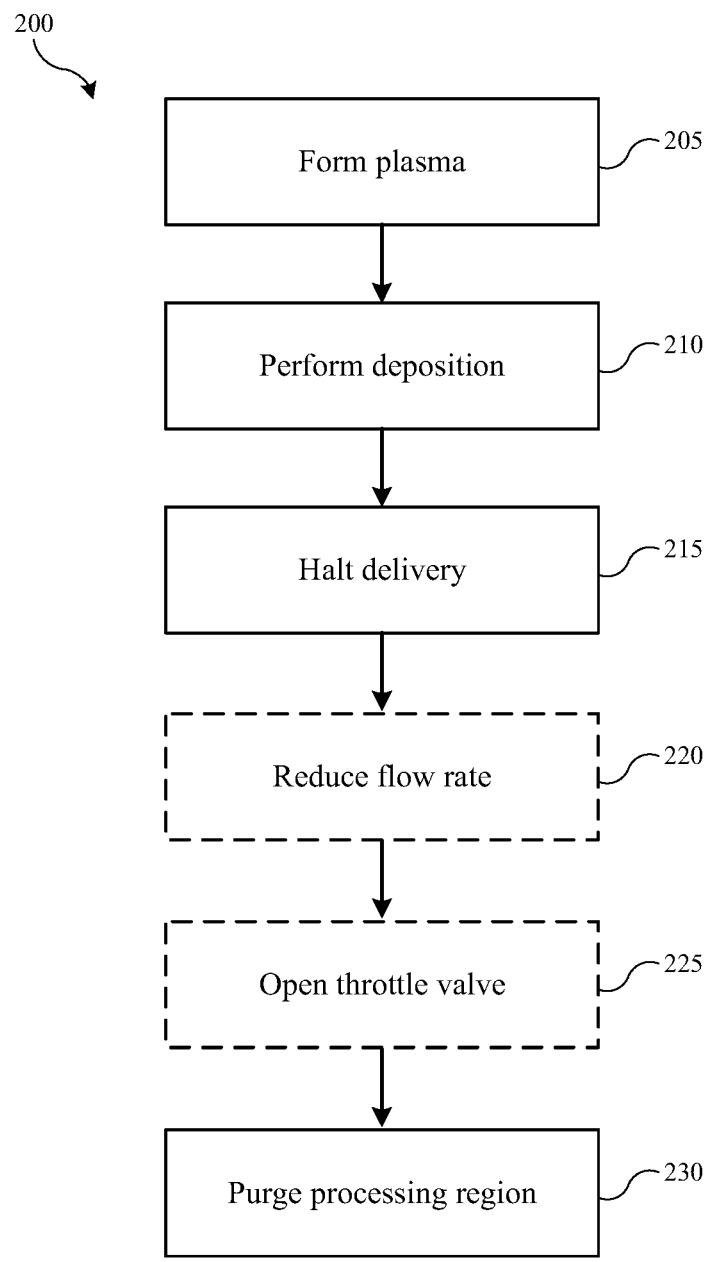
FIG. 2 shows exemplary operations in a deposition method according to some embodiments of the present technology.

FIG. 2 shows exemplary operations in a deposition method 200 according to some embodiments of the present technology. The method may be performed in a variety of processing chambers, including processing chamber 100 described above. The method may include performing a purge operation subsequent deposition, which may limit particle deposition on substrates. Method 200 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated.

Method 200 may include additional operations prior to initiation of the listed operations. For example, additional processing operations may include forming structures on a semiconductor substrate, which may include both forming and removing material. Prior processing operations may be performed in the chamber in which method 200 may be performed, or processing may be performed in one or more other processing chambers prior to delivering the substrate into the semiconductor processing chamber in which method 200 may be performed. Regardless, method 200 may optionally include delivering a semiconductor substrate to a processing region of a semiconductor processing chamber, such as processing chamber 100 described above, or other chambers that may include components as described above. The substrate may be deposited on a substrate support, which may be a pedestal such as substrate support 104, and which may reside in a processing region of the chamber, such as processing volume 120 described above. At operation 205, a plasma may be formed from one or more deposition precursors. The plasma may be formed between a substrate and a faceplate, such as described previously.

A deposition process may be performed at operation 210, in which a material may be deposited on the substrate to a target thickness. In exemplary embodiments, the deposition process may involve forming a plasma within the processing region of the semiconductor processing chamber to perform a plasma-enhanced deposition process of any of a variety of materials, for example, although non-plasma deposition processes may also be performed. An exemplary process may involve depositing silicon oxide, and may include utilizing a silicon-containing precursor, such as tetraethyl orthosilicate. It is to be understood that any number of other deposition operations may similarly be performed according to embodiments of the present technology. Along with the silicon-containing precursor, at least one additional precursor may be delivered and utilized to form the plasma. For example, an oxygen-containing precursor may be delivered, which may be or include oxygen, ozone, nitrous oxide, water, or any other oxygen-containing material. One or more carrier precursors may also be included, which may include an inert or non-chemically reactive precursor for the deposition, and which may include argon, helium, nitrogen, hydrogen, or any number of other precursors including one or more of these elements. Subsequent the deposition to achieve a target thickness, delivery of the deposition precursors may be halted.

Conventional processing may include halting formation of plasma by turning off a plasma power source, which may include a high-frequency and/or a low-frequency power, and then pumping or engaging an exhaust system to remove byproducts or residual precursor materials. When the plasma is halted, particles that may have been suspended in the plasma sheath may then fall to the wafer and contaminate the surface. Additionally, when a purge operation is initiated, particles or deposition materials that have attached to a faceplate or chamber surfaces may be detached. Although a portion of this material will be properly purged from the chamber, some of these particles may also be pulled from surfaces and fall to the substrate surface causing further contamination. As previously noted, many conventional technologies may simply accept this amount of contamination, and attempt to rectify the issue with additional polishing or post processing, for example.

The present technology may adjust the purging process, or the transition between processing and purging, relative to conventional technologies. For example, while conventional technologies may halt precursor flow and extinguish plasma formation, the present technology may maintain plasma formation in the processing chamber. For example, at operation 215, delivery of the silicon-containing precursor may be halted subsequent deposition that has occurred to a target thickness. However, delivery of one or more other precursors may be maintained in some embodiments of the present technology, which may allow plasma formation to be maintained. In some embodiments of the present technology, plasma formation within the processing region of the semiconductor processing chamber may be maintained during or throughout a purge process of the processing region, which may reduce the pressure within the chamber, and which may be performed at operation 230. To maintain the plasma formation without continuing to deposit additional material, delivery of the silicon-containing precursor may be halted, while delivery of the oxygen-containing precursor, or delivery of any other precursor may be maintained.

Plasma formation may include utilizing a high frequency plasma, such as 13.56 MHz or any other frequencies used in deposition processes. Although some embodiments may utilize only high frequency radio frequency plasma formation, some embodiments may include low frequency energy utilized in combination with high frequency energy during the plasma formation. While high frequency energy may increase plasma density, low frequency energy may provide a directionality to the plasma species. However, the low frequency energy, such as a radio-frequency signal of less than or about 3 kHz, may increase ion bombardment at the substrate level. During the purge operations of embodiments of the present technology, continued plasma formation that causes ion bombardment may affect the film properties of the material previously deposited. Accordingly, in some embodiments of the present technology where deposition may utilize both high frequency and low frequency signals for plasma formation, the low frequency signal may be halted subsequent deposition, while the high frequency signal may be maintained to produce plasma during the purge operation.

Although causing less ion bombardment than low frequency energy, high frequency signals may also cause an amount of ion bombardment at sufficient plasma power. Deposition operations may maintain a high frequency plasma power of greater than or about 1,000 W, and may maintain a high frequency plasma power of greater than or about 1,500 W, greater than or about 2,000 W, greater than or about 2,500 W, greater than or about 3,000 W, or more, to increase ion density and deposition rates. If maintained at these power levels during the purge operation, an amount of ion bombardment may occur. Accordingly, to reduce ion bombardment in some embodiments of the present technology, the present technology may reduce plasma power when the deposition has been completed, and the delivery of the silicon-containing precursor is halted to begin the purging process. In some embodiments, the high frequency plasma power may be maintained at a first plasma power while forming the plasma and depositing the material, and which may be any of the plasma powers noted above.

Subsequent deposition, and during the plasma maintaining operation during which the purging may be performed, the plasma power may be reduced from the first plasma power to a second plasma power. In some embodiments the second plasma power may be less than or about 1,500 W, and may be less than or about 1,000 W, less than or about 750 W, less than or about 500 W, less than or about 250 W, or less. To ensure adequate plasma density allowing falling particles to be trapped, the plasma power may be maintained above a threshold, which may be above or about 100 W, above or about 250 W, or more. This may allow falling particles to remain away from the substrate, while also reducing ion bombardment on the deposited film. Particles trapped or suspended in the plasma, such as in the plasma sheath, may then be pulled from the system by the exhaust with the carrier gases or oxygen-containing precursor as they flow through the system during the purge process.

During deposition operations, deposition may occur in a number of locations due to flow paths through the processing region and chamber. To limit deposition on a backside of the substrate support, such as the backside of a pedestal platen on which the substrate may be seated, a blocking precursor may be delivered through the processing chamber, such as from below the substrate support, or through the stem. The blocking precursor may be delivered to flow along the backside of the substrate support to limit or prevent deposition in this region. Such a precursor may produce an opposing force on precursors being delivered from above, however, and thus in some embodiments the method may include halting delivery of the blocking precursor when the deposition is completed, such as when or subsequent the delivery of the silicon-containing precursor is halted. For an exemplary silicon oxide deposition, oxygen may also be used as a blocking precursor, and this delivery from below the substrate support may be halted. This may facilitate the purging process, and removal of particles from the processing chamber.

Processing operations may also be affected by the distance maintained between a substrate and a showerhead. As described with chamber 100, a pedestal or substrate support may be vertically translatable in some embodiments, and may position a substrate near the faceplate, such as gas distributor 112, during some deposition or other processing operations. The substrate may be maintained at this first distance from the showerhead throughout the deposition process. In some processing chambers encompassed by the present technology, exhaust flows may extend below the substrate support, such as with outlet 152 of FIG. 1. When the distance between the substrate and the showerhead is maintained sufficiently low, purge flow may not fully extend across the substrate. Accordingly, in some embodiments, method 200 may optionally include repositioning the substrate support during the purging operation.

For example, once deposition has been completed or delivery of the silicon-containing precursor has been halted, and purging operation 230 may begin, the pedestal may reposition the substrate to a second distance from the showerhead, which may be a distance greater than the first distance. This may also occur when or while the first voltage is increased to the second voltage. By increasing the distance between the components, an exhaust flow may better draw across the showerhead, and may improve particle or contaminant removal. Accordingly, by increasing the distance, improved removal may be afforded. Hence, in some embodiments the second distance may be at least 25% greater than the first distance, and in some embodiments the second distance may be greater than or about 120% of the first distance, and may be greater than or about 150% of the first distance, greater than or about 200% of the first distance, greater than or about 250% of the first distance, greater than or about 300% of the first distance, greater than or about 350% of the first distance, greater than or about 400% of the first distance, greater than or about 450% of the first distance, greater than or about 500% of the first distance, greater than or about 550% of the first distance, or greater.

A purging operation may facilitate removal of residual particles within the processing region, and may also bring the pressure of the processing chamber to a system pressure, which may allow removal of the substrate from the semiconductor processing chamber. For example, exemplary deposition operations may occur at pressures greater than or about 3 Torr, greater than or about 5 Torr, greater than or about 10 Torr, greater than or about 12 Torr, or more. However, a system or platform on which the semiconductor processing chamber is included may be maintained at a pressure below or about 1 Torr, below or about 0.5 Torr, or less. Accordingly, in some embodiments, purging the processing region may include reducing a processing pressure within the chamber from a first processing pressure at which the deposition may be performed to a second processing pressure at which substrate removal may occur. Conventional technologies may perform this pressure reduction as quickly as possible to limit an effect on throughput through the system. However, as explained above, this may increase particle removal or flaking from a faceplate. This may cause additional particles to be deposited on the substrate.

The present technology may utilize the plasma maintained during the purging operation to limit or prevent particles from falling to the substrate, and may also reduce the number of falling particles by performing the pressure reduction over a period of time. In some embodiments the process may occur by more slowly ramping the pressure over the period of time, although in some embodiments a number of steps may be performed to gradually reduce the pressure, and each step may be performed or occur over a portion of the period of time. Reducing the pressure within a processing chamber may occur in one or more ways, including a combination of operations. For example, precursor flow through the chamber may be reduced, which may reduce the pressure through the chamber. Additionally and/or alternatively, a throttle valve may be incorporated between the chamber and an exhaust or pumping system, such as within a fore line or purge line extending from the chamber. The throttle valve may be maintained at an angle between 0°, or fully closed, and 90°, or fully open. Deposition processes may occur at a first throttle valve angle, and then the angle may be increased during the purging operation to lower the pressure. Accordingly, reducing the pressure within the processing chamber may occur by reducing flow rate of precursors being used to maintain the plasma, and/or increasing a throttle valve angle until a pressure within the chamber is reduced sufficiently to allow the substrate to be removed.

Reducing the flow of one or more of the additional precursors being utilized to maintain the plasma may occur at optional operation 220. For example, in exemplary embodiments where silicon oxide is being deposited, the additional precursor may be or include an oxygen-containing precursor. The flow of the oxygen-containing precursor may be reduced from a first flow rate at which deposition is being performed to a second flow rate, which produce a chamber pressure at the second processing pressure, such as below or about 3 Torr, below or about 1 Torr, below or about 0.5 Torr, or less. For example, the flow rate of the oxygen-containing precursor may be reduced gradually over the period of time from the first flow rate to the second flow rate, or the flow rate may be reduced in two or more steps, with each step being maintained for a portion of the period of time. In some embodiments, the period of time may be greater than or about 5 seconds, and may be greater than or about 10 seconds, greater than or about 15 seconds, greater than or about 20 seconds, or more. However, in some embodiments the period of time may be maintained less than or about 20 seconds to limit an increase in throughput for the process.

When a number of steps are performed, each step may occur for about two to about five seconds. When the operations are performed at less than or about two seconds, such as one second or less, fall on particles may be increased due to the more pronounced pressure change. Each step may be equal in some embodiments, or may be any fraction of the total change to affect the pressure as needed. The process may include two or more steps, and may include greater than or about three steps, greater than or about four steps, greater than or about five steps, or more, depending on the amount of pressure reduction, the volume of the chamber, and other characteristics of the process. For example, if the process may be performed with an oxygen-containing precursor delivery of about 10 slm, or more, and a flow rate to provide a desired pressure may be 4 slm, for example, the delivery may be ramped at a constant rate from 10 slm to 4 slm over the period of time, which may be any of the noted periods of time.

Additionally, the rate may be reduced in a number of steps. For example, a first step may reduce the flow rate from 10 slm to 8 slm for a first portion of the period of time, such as from about two to about five seconds, followed by a second reduction from 8 slm to 6 slm for a second portion of the period of time, which may be the same or different from the first. A third reduction from 6 slm to 4 slm may then be performed for a third portion of the period of time providing the entire period of time. The reduction may occur for a fraction of the portion of the period of time in some embodiments, and then be maintained at the step for the remainder of the portion of the period of time. For example, if each portion of the period of time is three seconds, the drop in flow rate may occur in one second or less, but then be maintained at the reduced flow rate for the remainder of the three seconds before the next reduction occurs. It is to be understood that these examples are not intended to be limiting, and any other reduction may occur as would be appreciated as encompassed by the present technology. In some embodiments a minimum flow rate may be maintained to ensure plasma is maintained. If further reductions in pressure are to occur, the reduction may include a combination of reducing the flow rate of the precursors and adjusting an angle of the throttle valve, or any other effect that may reduce the pressure within the chamber.

Increasing the angle of the throttle valve may occur at optional operation 225. For example, in some embodiments the throttle valve may be maintained at a first angle during processing. In one non-limiting example, the first angle may be 40°, which with precursor delivery may maintain a chamber pressure at 12 Torr for processing. To reduce the chamber pressure to a second pressure during the purge operation, the angle may be increased to 90°, or some lesser angle, over a period of time. Again, this may occur gradually on a constant ramp during the period of time, and may occur in a number of steps. The number of steps and the period of time, as well as the portions of the period of time, may be similar to as explained above for the adjustment to flow rate, and which may occur along with adjustment to flow rate as explained above. For example, in one non-limiting example, the throttle valve angle may be increased in at least two steps, with each step occurring for a portion of the period of time, and each portion being between about two seconds and about five seconds. The adjustments for each of the throttle valve and the flow rate may occur concurrently, sequentially, or in any combination to reduce the pressure within the chamber gradually.

Figure 3A:
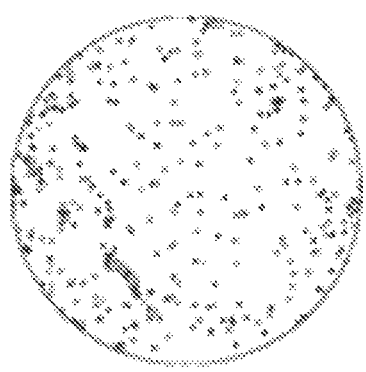
FIGS. 3A-3B show charts of residual particle deposition on substrates being processed according to some embodiments of the present technology.
Figure 3B:
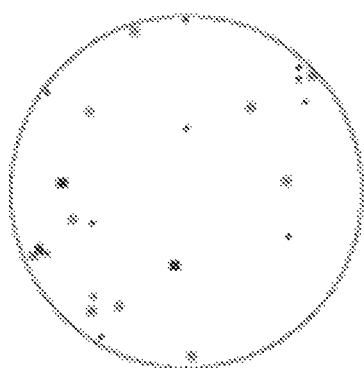

By trapping particles within the plasma maintained during purging and allowing the particles to be exhausted from the plasma with carrier gases flowing to exhaust during pump down operations as previously explained, less particles may be produced by the ramped pump down, and particles produced may not fall to the substrate as readily. FIG. 3A shows a chart of residual particle deposition on a substrate being processed with conventional technology where a film of greater than 5 µm was produced in a single pass deposition. As shown, by extinguishing plasma subsequent the deposition, and performing a rapid pump down, a large amount of particles fell to the substrate. FIG. 3B shows a chart of residual particle deposition on a substrate being processed by embodiments of the present technology. By maintaining a plasma during the pump down, and be performing a pump down in a series of steps over a period of time, particle deposition was substantially reduced.

By performing a ramped pump down, and/or by maintaining a plasma during the pump down or purge operations, particle contamination may be reduced relative to conventional technologies. For example, depending on the process being performed, experiments have shown that the particles of a threshold size were reduced from over several hundred particles to less than 20 particles for a film deposited to a thickness of greater than or about 8 µm in a single deposition operation. Maintaining plasma during the purge or pump down and performing a ramped pump down over a period of time may further reduce the particle contamination to less than or about 30% of a baseline amount of particles during conventional operations described previously, and may reduce particles to less than or about 25% of baseline particles, less than or about 20% of baseline particles, less than or about 15% of baseline particles, less than or about 14% of baseline particles, less than or about 13% of baseline particles, less than or about 12% of baseline particles, less than or about 11% of baseline particles, less than or about 10% of baseline particles, less than or about 9% of baseline particles, less than or about 8% of baseline particles, less than or about 7% of baseline particles, less than or about 6% of baseline particles, less than or about 5% of baseline particles, less than or about 4% of baseline particles, or less. Although this may improve particle defects for any type of deposition, the present technology may further improve the ability to produce thicker films in a single deposition operation without increasing particle contamination. By affording more deposition in a single operation, improved throughput may be realized over conventional technologies.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A deposition method comprising:
forming a plasma of a silicon-containing precursor and at least one additional precursor within a processing region of a semiconductor processing chamber, wherein the processing region houses a semiconductor substrate on a substrate support, and wherein forming the plasma occurs at a first plasma power;
depositing material on the semiconductor substrate to a target thickness;
delivering a blocking precursor from beneath the substrate support while depositing the material;
halting delivery of the silicon-containing precursor while maintaining the plasma with the at least one additional precursor, wherein maintaining the plasma comprises reducing plasma power from the first plasma power to a second plasma power, and wherein maintaining the plasma comprises reducing a flow rate of the at least one additional precursor;
halting delivery of the blocking precursor; and
purging the processing region of the semiconductor processing chamber.

2. The deposition method of claim 1, wherein the second plasma power is less than or about 1,000 W.

3. The deposition method of claim 1, wherein the semiconductor substrate is positioned at a first distance from a faceplate during the depositing, the method further comprising:
lowering the semiconductor substrate to a second distance from the faceplate during the purging of the processing region.

4. The deposition method of claim 1, wherein the silicon-containing precursor comprises tetraethyl orthosilicate.

5. The deposition method of claim 1, wherein depositing material on the semiconductor substrate is performed at a first processing pressure, and wherein purging the processing region of the semiconductor processing chamber comprises:
reducing processing pressure from the first processing pressure to a second processing pressure over a period of time.

6. The deposition method of claim 5, wherein reducing the processing pressure comprises reducing a flow rate of the at least one additional precursor.

7. The deposition method of claim 6, wherein the flow rate of the at least one additional precursor is reduced in at least two steps, and wherein each step occurs over a portion of the period of time.

8. The deposition method of claim 7, wherein each portion of the period of time is greater than or about two seconds.

9. The deposition method of claim 5, wherein reducing the processing pressure comprises increasing an angle of a throttle valve of a purge line of the semiconductor processing chamber.

10. The deposition method of claim 9, wherein the angle of a throttle valve of a purge line of the semiconductor processing chamber is increased in at least two steps, and wherein each step occurs over a portion of the period of time.

11. The deposition method of claim 10, wherein each portion of the period of time is greater than or about two seconds.

12. A deposition method comprising:
forming a plasma of a silicon-containing precursor and an oxygen-containing precursor within a processing region of a semiconductor processing chamber, wherein the processing region houses a semiconductor substrate on a substrate support;
depositing material on the semiconductor substrate to a target thickness, wherein the depositing is performed at a first processing pressure;
halting delivery of the silicon-containing precursor while maintaining the plasma with the oxygen-containing precursor; and
purging the processing region of the semiconductor processing chamber, wherein purging the processing region of the semiconductor processing chamber comprises:
reducing processing pressure from the first processing pressure to a second processing pressure over a period of time, wherein reducing the processing pressure comprises reducing a flow rate of the oxygen-containing precursor.

13. The deposition method of claim 12, wherein the period of time is greater than or about 5 seconds.

14. The deposition method of claim 12, wherein reducing the processing pressure further comprises:
increasing an angle of a throttle valve of a purge line of the semiconductor processing chamber.

15. A deposition method comprising:
forming a plasma of a silicon-containing precursor and an oxygen-containing precursor within a processing region of a semiconductor processing chamber, wherein the processing region houses a semiconductor substrate on a substrate support;
depositing material on the semiconductor substrate to a target thickness, wherein the depositing is performed at a first processing pressure;
halting delivery of the silicon-containing precursor while maintaining the plasma with the oxygen-containing precursor; and
purging the processing region of the semiconductor processing chamber, wherein purging the processing region of the semiconductor processing chamber comprises:
increasing an angle of a throttle valve of a purge line of the semiconductor processing chamber to reduce processing pressure from the first processing pressure to a second processing pressure over a period of time.

16. The deposition method of claim 15, wherein the period of time is greater than or about 5 seconds.

17. The deposition method of claim 15, wherein reducing the processing pressure further comprises:
reducing a flow rate of the oxygen-containing precursor.

* * * * *